United States Patent [19]

Wan et al.

[11] Patent Number: 4,701,937
[45] Date of Patent: Oct. 20, 1987

[54] SIGNAL STORAGE AND REPLAY SYSTEM

[75] Inventors: Shyue-Yun Wan; Jeng-Joung Guo; Cheng-Fung Lin, all of Hsin-Chu, Taiwan

[73] Assignee: Industrial Technology Research Institute Republic of China, Hsin-Chu, Taiwan

[21] Appl. No.: 732,934

[22] Filed: May 13, 1985

[51] Int. Cl.$^4$ .......................................... H04B 14/04
[52] U.S. Cl. ...................................... 375/25; 381/35; 365/189
[58] Field of Search .................... 375/3, 10, 118, 122, 375/25; 381/34, 35, 46; 365/189, 190, 191, 230, 231; 360/63, 71, 72.1

[56] References Cited

U.S. PATENT DOCUMENTS

| | | | |
|---|---|---|---|
| 4,087,632 | 5/1978 | Hafer | 381/43 |
| 4,236,205 | 11/1980 | Kindseth et al. | 364/200 |
| 4,331,837 | 5/1982 | Soumagne | 381/41 |
| 4,376,874 | 3/1983 | Karban et al. | 381/34 |
| 4,434,498 | 2/1984 | Mathieu | 375/118 |
| 4,581,718 | 4/1986 | Oishi | 365/189 |

Primary Examiner—Robert L. Griffin
Assistant Examiner—Stephen Chin
Attorney, Agent, or Firm—Hung Chang Lin

[57] ABSTRACT

A fixed pattern signal storage and replay system in which the silent periods of the signal are not stored but regenerated. During the silent periods of the signal, which is pulse code modulated, the decoder for the storage memory is inactivated.

8 Claims, 8 Drawing Figures

Data Code

| $X_3X_2X_1X_0$ | $B_4$ | $B_3$ | $B_2$ | $B_1$ |
|---|---|---|---|---|
| 0 0 0 0 | 1 | 0 | 0 | 0 |
| 0 0 0 1 | 1 | 1 | 0 | 0 |
| 0 0 1 0 | 1 | 1 | 1 | 1 |
| 0 0 1 1 | 1 | 1 | 0 | 0 |
| 0 1 0 0 | 0 | 1 | 0 | 0 |
| 0 1 0 1 | 0 | 0 | 0 | 0 |
| 0 1 1 0 | 0 | 1 | 0 | 0 |
| 0 1 1 1 | 1 | 0 | 0 | 0 |
| 1 0 0 0 | 1 | 0 | 0 | 0 |
| 1 0 0 1 | 1 | 0 | 0 | 0 |
| 1 0 1 0 | 1 | 0 | 0 | 0 |
| 1 0 1 1 | 1 | 0 | 0 | 0 |
| 1 1 0 0 | 1 | 1 | 0 | 0 |
| 1 1 0 1 | 1 | 1 | 1 | 1 |
| 1 1 1 0 | 1 | 1 | 0 | 0 |
| 1 1 1 1 | 0 | 1 | 0 | 0 |

Address Code

Table 1

B1

$X_1X_0$

| $X_3X_2$ | 00 | 01 | 10 | 11 |
|---|---|---|---|---|
| 00 | 0 | 0 | 1 | 0 |
| 01 | 0 | 0 | 0 | 0 |
| 10 | 0 | 0 | 0 | 0 |
| 11 | 0 | 1 | 0 | 0 |

B2

$X_1X_0$

| $X_3X_2$ | 00 | 01 | 10 | 11 |
|---|---|---|---|---|
| 00 | 0 | 0 | 1 | 0 |
| 01 | 0 | 0 | 0 | 0 |
| 10 | 0 | 0 | 0 | 0 |
| 11 | 0 | 1 | 0 | 0 |

B3

$X_1X_0$

| $X_3X_2$ | 00 | 01 | 10 | 11 |
|---|---|---|---|---|
| 00 | 0 | 1 | 1 | 1 |
| 01 | 1 | 0 | 1 | 0 |
| 10 | 0 | 0 | 0 | 0 |
| 11 | 1 | 1 | 1 | 1 |

B4

$X_1X_0$

| $X_3X_2$ | 00 | 01 | 10 | 11 |
|---|---|---|---|---|
| 00 | 1 | 1 | 1 | 1 |
| 01 | 0 | 0 | 0 | 1 |
| 10 | 1 | 1 | 1 | 1 |
| 11 | 1 | 1 | 1 | 0 |

FIG.5

SIGNAL STORAGE AND REPLAY SYSTEM

BACKGROUND OF THE INVENTION

In ordinary real time signals such as voice or picture, there are usually silent periods which typically occupy from 20% to 40% of the time. Such a signal can be converted into digital signal for digital trnsmission and reproduction. For such a system, the signal can be processed by means of pulse code modulation, difference pulse code modulation, delta modulation or adaptive predictive difference code modulation. In these modulation methods, an analog signal is sampled at different time intervals and quantized into many levels.

If the signal has a fixed pattern such as that in a music box or recordings, the signal can be stored in a memory and played back when instructed. For such an application, it is desirable to conserve the memory capacity for economical reasons.

BRIEF DESCRIPTION OF HE DRAWINGS

FIG. 5 shows the 2-dimensional matrix representation of the relationship between amplitude data code and the timing address code for different bits.

SUMMARY OF THE INVENTION

An object of this invention is to devise a means to eliminate the storage of silent signal in a recorded communication system.

Another object of this invention is to conserve the memory capacity of such a communication system for the storage of recorded signal such as voice.

A further object of this invention is to utilize a simple decoding and storage circuit to implement the foregoing objects.

A final object of this invention is to design a simple and economical integrated circuit for digital communication.

These objects are achieved in this invention by means of pulse code modulation. During the silent periods of the signal, the content is not stored in the memory and the decoders for the memory is inactivated. By eliminating the storage of silent signal, the memory size is reduced. By partially decoding the timing address codes, the decoder circuit is simplified.

DETAILED DESCRIPTION

In digital communication systems, an analog signal such as that of voice or picture is sampled in small intervals of time. During each sampling interval, the signal amplitude is quantized into finite number of levels. These quantized levels are then converted into digital signals by analog to digital conversion techniques well known in the art. In the conversion, the successive speech samples are converted into digitally coded signal having a value corresponding to the amplitude of the speech sample. Digital signals from the A to D converter is transformed into efficient coded signals with encoders. The coding method can be pulse code modulation, difference pulse code modulation, delta modulation or predicative difference code modulation. Such modulation methods are well known.

Figure 1A:
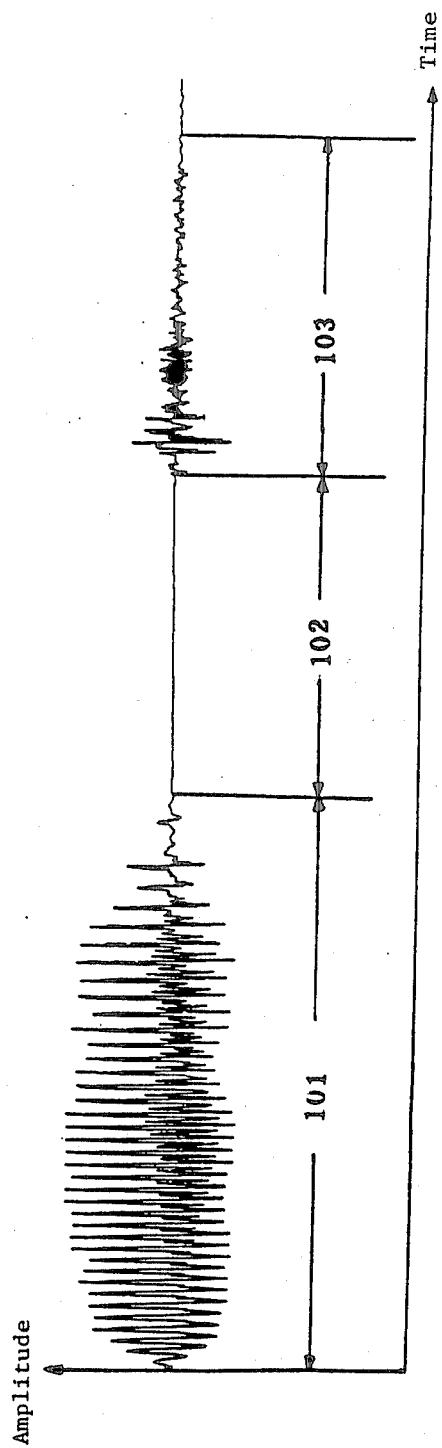
FIG. 1(a) shows a typical voice waveform.

In a real time signal, the waveform usually contains certain percentage of silent periods where the waveform does not change amplitude. For example, the waveform of the word "six" is shown in FIG. 1(a). In this figure, the amplitude of the signal is plotted as ordinate and the time is plotted as abscissa. For the duration 101 and 103, the amplitude varies with time. For the duration 102, there is no change in amplitude and this period is known as the silent period. In a voice signal, the silent periods typically occupy from 20% to 40% of the time.

After the analog signal is coded into digital signals such as binary pulses, the digital information is stored in a memory. When the signal is played back, the information stored in the memory is decoded and converted back into analog signals. Such a decoding and regeneration method is well known in the art. Reference may be found in the book: "Waveform Quantization and Coding", edited by N. S. Jayant and published by IEEE Press.

Figure 1B:
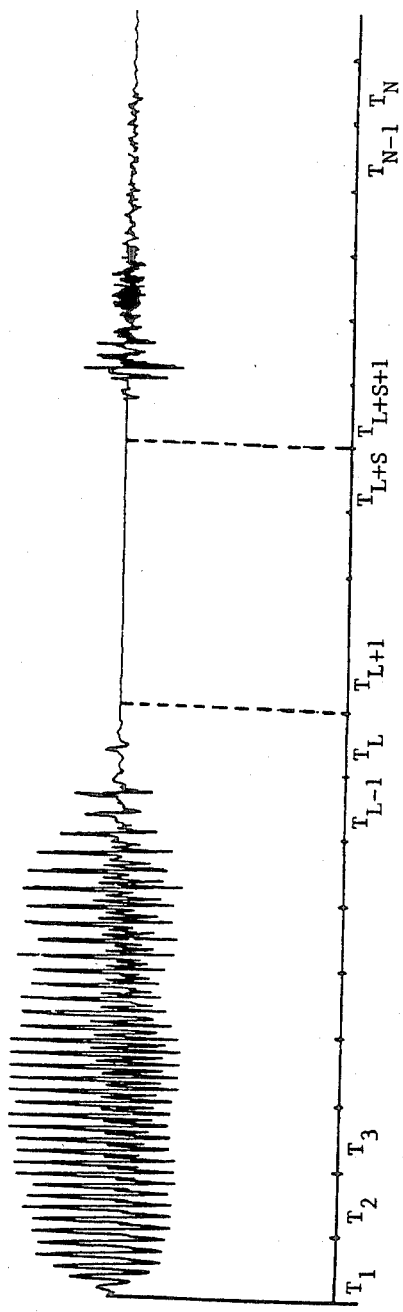
FIG. 1(b) shows the time varying periods and the silent period of the waveform.

The signal in FIG. 1(a) is divided into N time intervals in FIG. 1(b) as T1,T2 . . . TL−1,TL . . . TL+S,TL+S+1 . . . TN−1,TN. From time intervals T1 to TL, the signal is time varying. From time intervals TL+1 to TL+S, the signal is silent. From TL+S+1 to TN, the signal is again time varying.

Figure 2A:
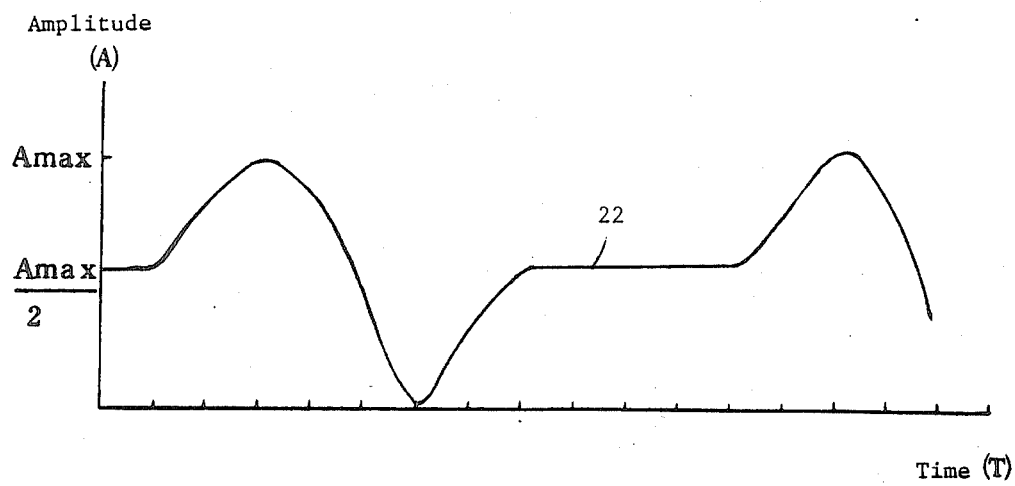
FIG. 2(a) shows an expanded waveform with time-varying periods and silent period.
Figure 2B:
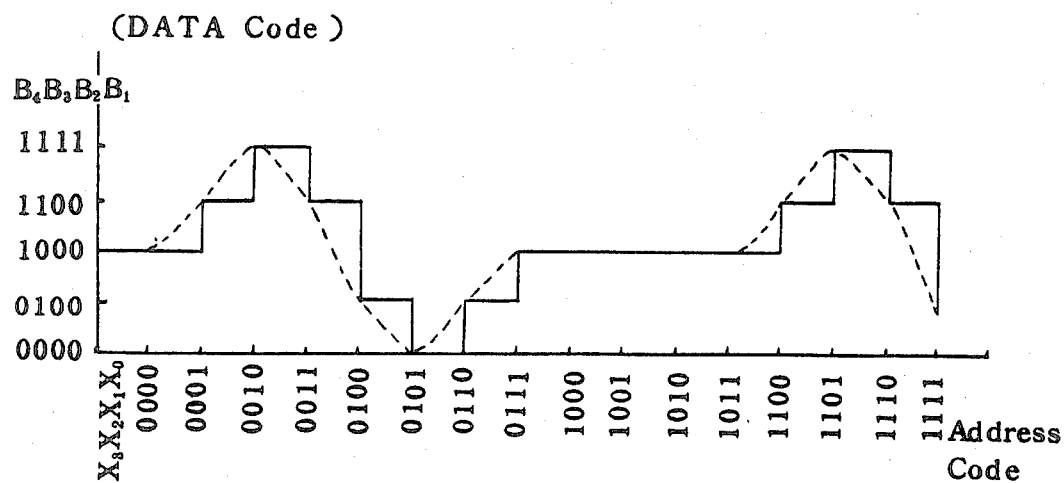
FIG. 2(b) shows the amplitude data codes and the timing address codes for the signal shown in FIG. 2(a).

A feature of this invention is that the signal during the silent period is not stored in the memory. Only the time varying portion of the signal is stored in the memroy. An expanded scale of the siganl waveform is shown in FIG. 2(a). The signal is divided into a number of N sampling points, SP1, SP2, SP3 . . . SPN. Each sampling point is a binary code of I bits with 2 to the Ith power time divisions. The amplitude of each sampling point can also be represented by a binary code of J bits with 2 to the Jth power time subdivisions. In FIG. 2(b), I=4, J=4. A number of M sampling points form a section. If the amplitude of any section falls below certain value, the signal is considered as a silent signal. When a digitized binary signal is stored in the memory, each code group has particular set of addresses. However, when a silent signal is encountered, the timing address code keeps on counting, but the coded silent signal amplitude data are not stored in the memory.

Figure 3:
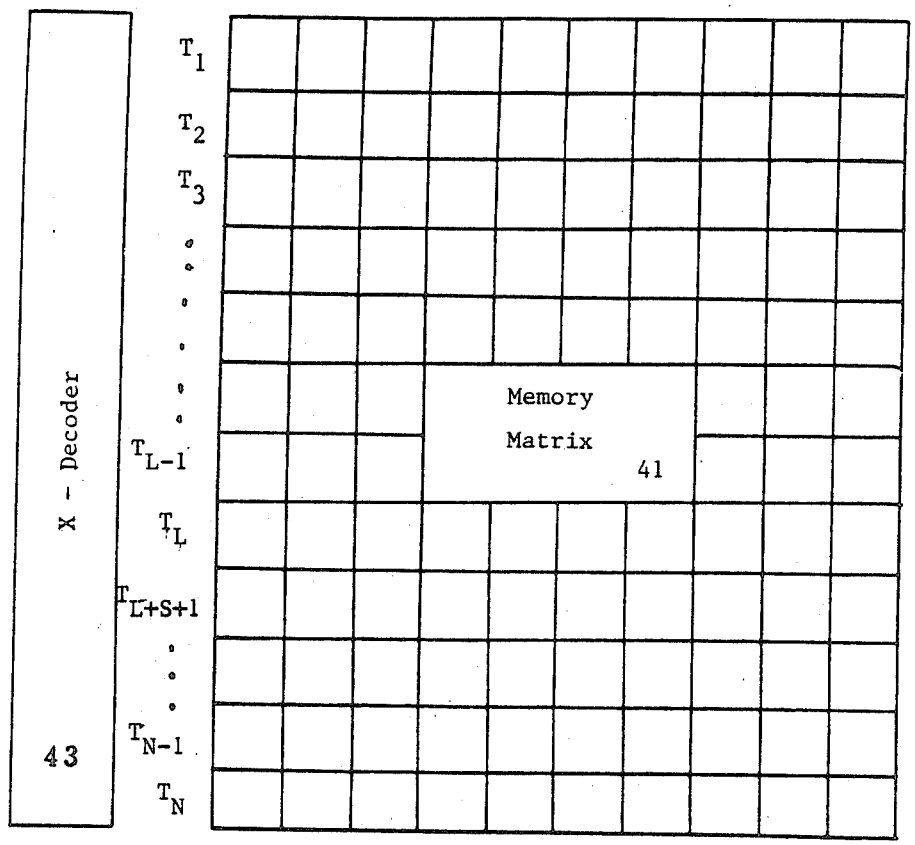
FIG. 3 shows a memory organization for storing a pulse code modulation signal.

The basic organization for implementing this scheme is shown in FIG. 3. The memory is organized to contain an X-decoder 43, a Y-decoder 42, and memory matrix 41. In the memory matrix 41, each small rectangle represents a bit of stored data. Each row stores the binary codes of one code group, e.g. B1,B2,B3 . . . BM−1,BM. The decoders produce outputs to select the particular bits in the memory. The time sequence in selecting is determined by an address code, whose products appear at the outputs of the decoders.)

Figure 4:
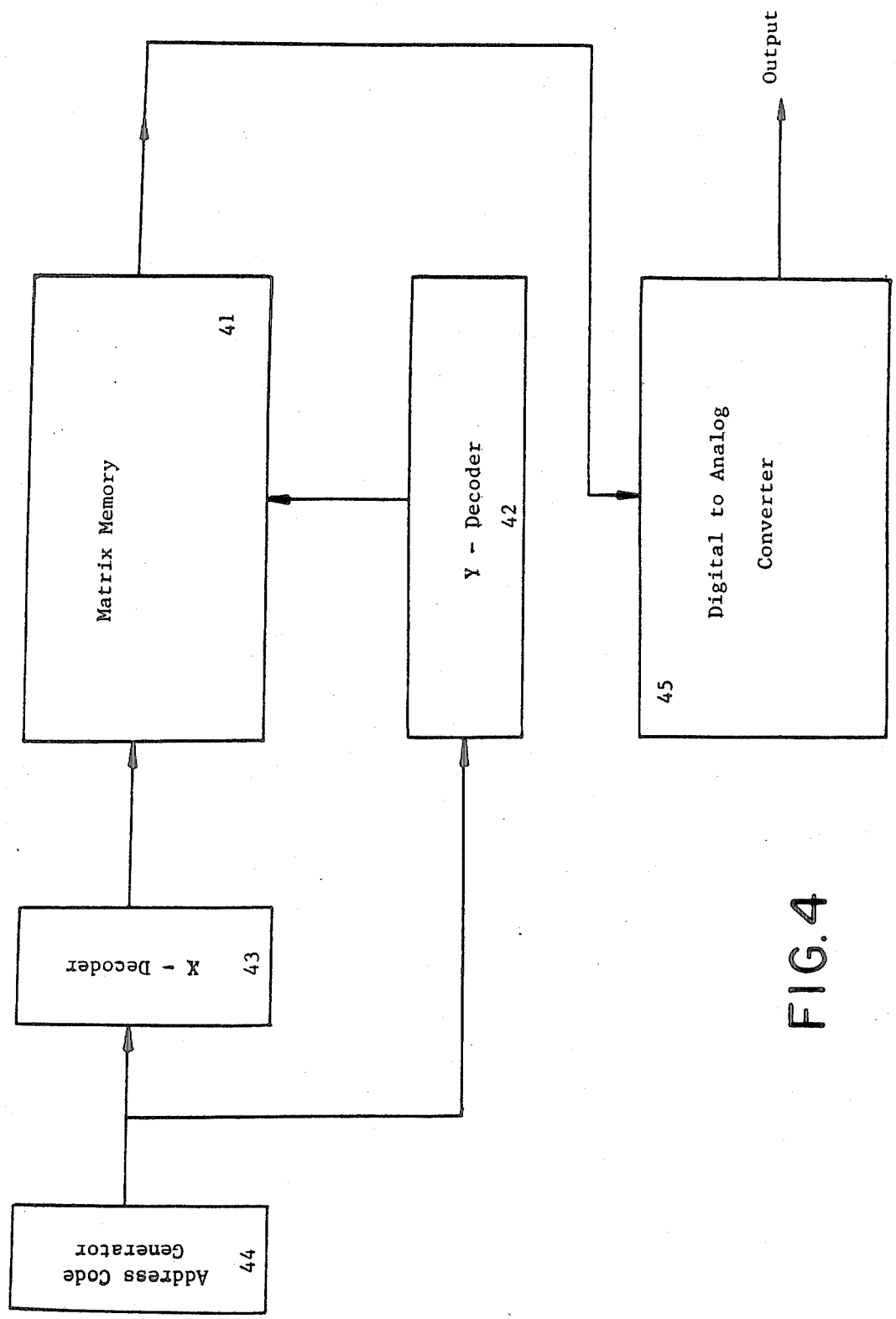
FIG. 4 shows a system for storing and reproducing a signal.

This memory organization is used in a system as shown in FIG. 4. An input signal Vin is fed to an analog-to-digital (A/D) converter 46. The output of the A/D converter is used to feed an address code generator 44. Here, the address code generator 44 is used to generate inputs for the X- and Y-decoders. The data code outputs of the memory matrix is fed to a digital to analog converter 45 to reproduce the original signal.

Referring to the signal shown in FIG. 2(a) again, the abscissa represents time and the ordinate represents amplitude. The signal is sampled into a number of time intervals and the amplitude is quantized into discrete levels as shown in FIG. 2(b). The time intervals can be represented by an address code, X3X 2X1X0. For example, the code 0000 represents the first time inteval; 0001, the second interval, etc in a binary counting sequence. The amplitude is represented by a binary data code 0111 for maximum amplitude and 1000 for minimum amplitude. In this waveform, the amplitude between the timing address code 0111 and 1100 is constant and represents a silent period. The coded time varying amplitude between the coded time period 0000 and 0111 is stored in the memory. Then comes the silent period from the coded time period 0111 to 1100. According to this invention, the coded amplitude data during this period is not stored in the memory. After the silent period, the amplitude between the coded timing address code 1100 and 1111 is time varying again.

Table I shows the relationship between the timing address code and the amplitude data code. In this table, B1 is the least significant bit for the amplitude data code and B4 is the most significant bit. If the data code is sequentially tabulated bit by bit as a function of timing address code, the relationship can be represented by four matrices, one for each bit as shown in FIG. 5. In each matrix, the rows represent the $X_3X_2$ address code products and the columns represent the $X_1X_0$ address code products. Thus, the first, second and fourth rows from the top represent the time varying signal periods and the third row represents the silent period.

According to the present invention, the data codes during the silent period are not stored in the memory matrix. This is accomplished by eliminating the decoder output products of the address codes representing the silent period, and furnishing only the partial products during the time varying signal periods. For the waveform in FIG. 3, the decoders given product outputs from sampling intervals T1 to TL, no product output from sampling periods TL to TL+S, and again product outputs for sampling intervals from T+S+1 to TN. These products are arranged to drive the X-select lines and Y-select lines for two-dimensional addressing of a memory cell.

The matrices shown in FIG. 5 are translated into an integrated circuit shown in FIGS. 6(a), 6(b), 6(c), 6(d). The X-decoder 243, the Y-decoder 242 and the memory unit 241 correspond to the organization in FIG. 3. However, instead of 1-dimensional addressing only from the X-decoder as implied in FIG. 3, the time sequence as represented by the address code in FIG. 2(b) is obtained by 2-dimensional addressing from the X-decoder 243 and the Y-decoder 242.

The circuits are composed of a number of metal-oxide-semiconductor field effect transistors (MOSFET). Some of the MOSFETs are of enhancement mode and others are of depletion mode. The X-decoder 243 is a selector logic circuit. The circuit has a number of enhancement mode MOSFETs used as pass transistors and connected in series with a number of depletion mode MOSFETs. The drain and the source of the pass transistor become conducting when a binary "1" level voltage is applied to the gate. The depletion mode MOSFET is conducting all the time. There are as many enhancement mode MOSFETs in each row as there are address codes in the X-decoder. For instance, when the product $X_3X_2$ is selected, the enhancement mode MOSFETs of the first row of the X-decoder are turned on. These series enhancement mode MOSFETs are connected to a load device R13 to form a NAND logic gate (for a positive logic system). The load device is another MOSFET, which can be turned on when a clock pulse $\overline{01}$ is applied to the gate.

Since the same X-decoder is the same for all the matrices, the same X-decoder can be shared by more than one matrix.

Similarly, the Y-decoder 242 is another selector logic circuit. Each vertical column becomes conductive, according to the products $\overline{X}_0\overline{X}_1, X_0\overline{X}_1, \overline{X}_0X_1$ and $X_0X_1$. These circuits become the Y select lines for the memory cells.

Figure 6A:
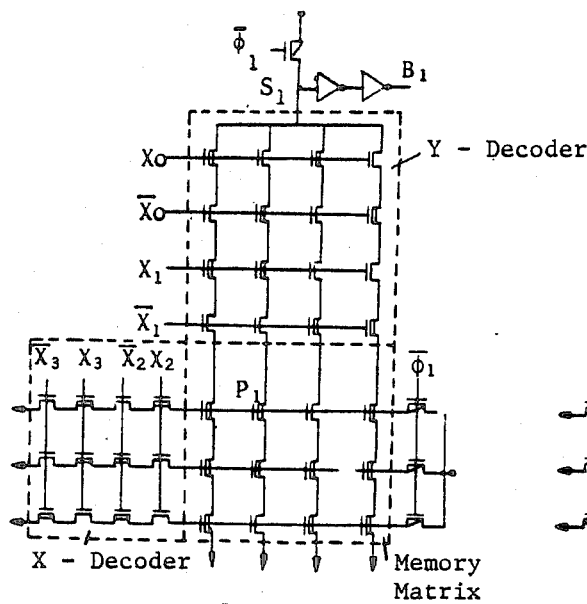
FIG. 6 shows the circuit diagram of the memory according the present invention; (a) for the least significant bit, (b) for the second significant bit, (c) for the third significant bit, (d) for the most significant bit.
Figure 6B:
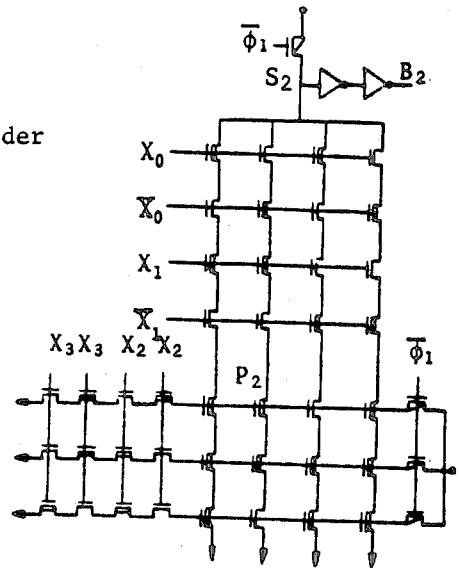
Figure 6C:
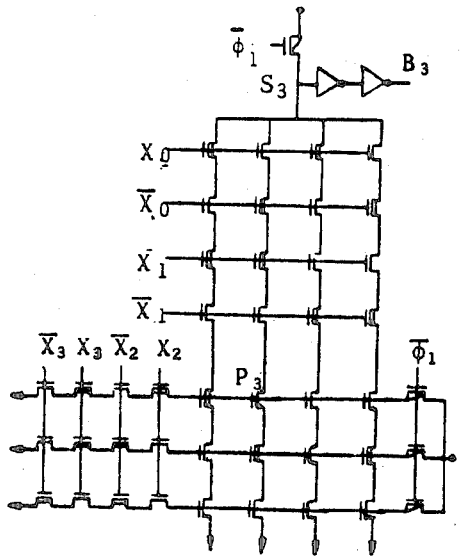
Figure 6D:
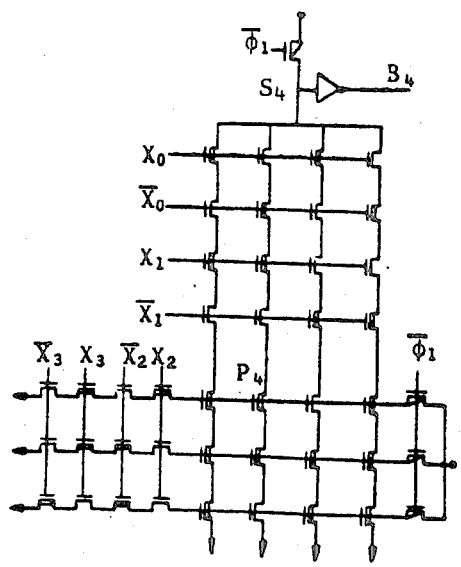

In the memory unit, there are also an array of MOSFETs. These MOSFETs are arranged in a matrix according to the matrix shown in FIG. 5 and located at the cross-points of the X-select lines and the Y-select lines. Each X-select line drives the gates of those MOSFETs at the cross-points in one row. The MOSFETs in one column are connected in series as pass transistors to a Y-select line. At any cross-point, a logic "0" can be represented by an depletion-mode MOSFET and a logic "1", represented by an enhancement-mode MOSFET as shown in FIG. 6(a), 6(b) and 6(c) corresponding to the matices for B1, B2, B3 in FIG. 5. Alternatively, a logic "0" at a cross-point can be represented by an enhancement-mode MOSFET and a logic "1", represented by a depletion-mode MOSFET as shown in FIG. 6(d) corresponding to the matrix for B4 in FIG. 5. For a row corresponding to a silent period, there is no select line for that product (e.g. $X_3X_2$ in the example). Hence that row is skipped and no memory MOSFET is used. Thus the memory capacity is conserved. The pass transistors in one column of the memory matrix are connected in series with the pass transistors in the Y-decoder and a load device such as R1,R2,R3 or R4 to form a NAND logic gate. The output of a logic gate such as S1,S2,S3,S4 gives the data code corresponding to the timing address code. The output of the logic gate can be fed through two buffers such as I14 and I24 to obtain the data codes B4,B3,B2,B1. Type I14 buffer consists of two inverters, which invert twice the input such as S3 in FIG. 6(c) to make the output B3 logic level the same as the input S3. Type I24 buffer consists of one inverter, which inverts the input logic level such as S4 in FIG. (d) as the output B4. For example, when the address code 0001 is selected i.e. $\overline{X}HD\ 3=0$, $X_3=1$, $X_2=0$, $\overline{X}_2=1$; $X_1=0$, $\overline{X}_1=1$; $X_0=1$, $\overline{X}_0=0$), the data code should be B1=0, B2=0, B3=1, B4=1 as indicated in FIG. 5 and FIG. 2(b). With $X_3=0$, $X_2=0$, $X_1=0$, $X_0=1$, the first row and the second column of the memory matrix are selected. When a row is selected, the gates along that row in the memory matirix all become low. When the gates of MOSFETs are low, the corresponding enhancement-mode MOSFETs are turned off, but not the depletion-mode MOSFETs. In FIG. 6, the depletion-mode MOSFET P4 at the cross-point B4 matrix in FIG. 6(d) is not turned off. The rest of the unselected lines are at "1" logic levels and hence the MOSFETs in all these rows are on. Since P4 is on, the output of the NAND gate goes to "0" level, as the buffered output B4 goes to "1". On the other hand, P3 in the B3 matrix in FIG. 6(c) is turned off and the output B3 is also at "1" level. In the rest of the circuit, the MOSFETs at the corresponding cross-points (i.e. row 1, column 2) are of depletion mode, which cannot be turned off when selected. Therefore the outputs B2 and B1 in FIGS. 6(a) and 6(b) are low at "0" level.

Note that the third rows of the matrices in FIG. 5, which represent the silent signal, are not included in the memory matrix in FIG. 6. Thus one row of MOSFETs is eliminated, thereby conserving chip area in an integrated circuit.

The memory matrix is basically a Read-only memory. As in conventional ROMs, the MOSFETs in the matrices can be programmed by different techniques such as those used for custom masking, electrically alterable ROMs, non-volatile memory, etc, which are well-known in the semiconductor industry.

What is claimed is:

1. A digital communication system for storing and reproducing a fixed pattern nonperiodic sampled signal which is quantized and encoded into data codes and has silent periods represented by a particular data code, comprising means for generating address codes in a sequence of time steps, means for storing said data codes in different cells in a memory except data code for said silent periods without using synchronization and time code as in a real time system, means for feeding said address codes to one or more X-decoders and Y-decoders, means for partially decoding said address codes in said decoder to eliminate decoder output during said silent periods, means for addressing said memory cells from said decoders sequentially corresponding to said address codes except during silent periods, said decoders having outputs to drive X-select lines and Y-select lines for two-dimensional addressing of a particular said cell, means for regenerating said data codes of original non-periodic sampled signal when said memory cells are addressed, means for regenerating said silent period particular data code when there is no decoder output to drive said select lines during said silent periods.

2. A digital communication system as described in claim 1, wherein each said decoder comprises a number of selector logic circuits, each said selector logic having a number of depletion-mode metal-oxide-semiconductor field effect transistors (MOSFETs) and enhancement-mode MOSFETs, each said MOSFET having a drain, a source and a gate, said enhancement-mode MOSFET acting as a pass transistor conducting between said drain and said source when turned on by respective said gate voltage, said pass transistors connected in series with a load device, said selector logic circuit being selected by turning on all said enhancement-mode MOSFETs in said circuit with inputs as represented by a timing address code.

3. A digital communication system as described in claim 2, wherein said partially decoding means has partial products of said timing address code, said products appearing at outputs of said decoders to drive said select lines.

4. A digital communication system as described in claim 1, wherein said memory comprises a number of enhancement-mode metal-oxide-semiconductor field effect transistors (MOSFETs) and depletion-mode MOSFETs as said memory cells representing respectively two binary logic levelsat cross-points of said X-select lines and Y-select lines, said enhancement-mode MOSFETs having been preprogrammed according to said data codes of said signal, said MOSFETs in said memory forming pass transistors connected in series with one of said Y-select lines as a second logic gate, said MOSFETs in said memory having gates connected to an controlled by said X-select lines.

5. A digital communication system as describeds in claim 4, wherein there are J output bits to form 2 to the Jth power of said quantized levels.

6. A digital communication system as described in claim 5, wherein each said output bit is an output of said second logic gate having same logic level as memory cell being selected by said 2-dimensional addressing means.

7. A digital communication system as described in claim 3, wherein said memory comprises a number of enhancement-mode MOSFETs and depletion-mode MOSFETs as said memory cells representing respectively two binary logic levels at cross-points of X-select lines and Y-select lines, said MOSFETs in said memory having been preprogrammed to set said respective modes according to contents of said signal, said X-select lines controlling the gates of MOSFETs at said cross-points, said MOSFETs at cross-points connected as pass transistors in series with said Y-select lines to form a second logic gate, said second logic gate having an output which forms one bit of said encoded signal.

8. A digital communication system as described in claim 6, wherein each said X-decoder controls the gates of pass transistors of said Y-select lines at said cross-points for more than one said bit.

* * * * *